(12) United States Patent
Richard

(10) Patent No.: US 8,032,813 B2
(45) Date of Patent: Oct. 4, 2011

(54) CONCURRENT PRODUCTION OF CRC SYNDROMES FOR DIFFERENT DATA BLOCKS IN AN INPUT DATA SEQUENCE

(75) Inventor: Elizabeth Anne Richard, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1112 days.

(21) Appl. No.: 11/778,754

(22) Filed: Jul. 17, 2007

(65) Prior Publication Data

US 2009/0024898 A1    Jan. 22, 2009

(51) Int. Cl.
*H03M 13/00* (2006.01)
(52) U.S. Cl. ........ 714/757; 714/785; 714/807; 714/819; 714/758; 702/189
(58) Field of Classification Search .................. 714/757, 714/758, 785, 807, 819; 702/189
See application file for complete search history.

(56) References Cited

U.S. PATENT DOCUMENTS

| 5,563,896 | A | * | 10/1996 | Nakaguchi | 714/785 |
| 5,748,652 | A | * | 5/1998 | Kim | 714/807 |
| 6,052,815 | A | * | 4/2000 | Zook | 714/758 |
| 2002/0046382 | A1 | * | 4/2002 | Yang | 714/758 |

* cited by examiner

*Primary Examiner* — Guy Lamarre
(74) *Attorney, Agent, or Firm* — Wade J. Brady, III; Frederick J. Telecky, Jr.

(57) ABSTRACT

Cyclic redundancy check (CRC) processing is applied to a received sequence of data blocks that are defined by respective sequences of sets of parallel data. For each data block, there is produced a sequence of syndromes that respectively correspond to the sets of parallel data within the data block. The final syndrome in the sequence of syndromes corresponds to all of the data in the data block. The time required for CRC processing can be reduced by concurrently producing first and second ones of the syndromes that respectively correspond to first and second ones of the sets that are respectively contained in first and second ones of the data blocks.

20 Claims, 2 Drawing Sheets

CONCURRENT PRODUCTION OF CRC SYNDROMES FOR DIFFERENT DATA BLOCKS IN AN INPUT DATA SEQUENCE

This application discloses subject matter related to subject matter disclosed in copending, commonly assigned U.S. patent application Ser. No. 11/778,860 of inventor Elizabeth Anne Richard, entitled "CRC SYNDROME GENERATION FOR MULTIPLE DATA INPUT WIDTHS".

FIELD OF THE INVENTION

The invention relates generally to cyclic redundancy check (CRC) processing and, more particularly, to syndrome generation in CRC processing.

BACKGROUND OF THE INVENTION

Conventional CRC operation involves processing a data stream against a known CRC polynomial that yields a result that is nearly unique to that data stream. Modifications of bits in the data stream cause different CRC results. Consequently, if data is corrupted in delivery of the stream, the calculated CRC results will not match the expected CRC results. The width and values in the polynomial determine the strength (uniqueness) of the CRC. A next-state decoder (NSD) implements the calculation of the CRC polynomial against the incoming data. The CRC is widely applicable in many situations, for example, in endeavors that transmit, receive, store, retrieve, transfer, or otherwise communicate electronically represented digital information.

According to conventional CRC operation, and as shown in FIG. 1, a syndrome 11 contained in a feedback register (FB REG) 12 is fed back to the syndrome input 10 of the NSD 14. The NSD 14 also receives the current parallel set of incoming data bits at 13. The resulting output 15 of the NSD 14 is registered into the feedback register 12, and thus becomes the next syndrome at 11 for the NSD 14 to use with the next parallel set of incoming data bits at 13. The initial state of the feedback register 12 (i.e., the initial syndrome value 11) is set to an appropriate value for the CRC polynomial that has been selected for use. A checksum generator 16 performs a predetermined operation on the final syndrome value 11 contained in the feedback register 12 after all of the incoming data 13 has been processed. The checksum generator 16 produces a CRC checksum value 17. The checksum value determined by the checksum generator 16 could be associated with (e.g., concatenated with, appended to, etc.) the data 13 for transmission, transfer, storage, etc., together with the data. An example would be a transmit packet having a checksum field associated with its data (payload) portion. The checksum value determined by the checksum generator 16 could be compared to a further checksum value that has been received, retrieved, etc., together with the data 13. An example would be a received packet whose checksum field contains the further checksum value and whose data (payload) portion contains the data 13. Comparison of the further checksum value to the checksum value determined by the checksum generator 16 provides a basis for evaluating the validity of the received data 13.

The operation performed by any given NSD (such as NSD 14) conventionally requires a single specific input data width. For example, the NSD 14 is specifically designed to operate on the parallel data width (e.g., bus width) supported by the data input 13. However, if a data block (e.g., the data payload portion of a packet) received at data input 13 is naturally aligned on boundaries that differ from the data width required by the NSD 14, then at least one of the first-received and last-received parallel sets of data within the block cannot be guaranteed to comply with the NSD's required data width. The parallel sets of data in the block between the starting and ending sets will of course comply with the required data width. The aforementioned width misalignment between the format of the received data block and the input data width of the NSD prevents the NSD from properly determining the final syndrome for the received data block. The input data width (e.g., at data input 13 of NSD 14) could be set to the narrowest data width that the misaligned data block is expected to present, but this effectively limits the width of the input data stream, and can thus impose a corresponding limit on data throughput in the CRC processing. On the other hand, if the input data width at 13 is not limited to the narrowest data width that the misaligned block is expected to present, then data from two consecutive data blocks could be presented at the data input at the same time (e.g., during a single clock cycle). The CRC architecture of FIG. 1 does not contemplate this type of situation.

It is therefore desirable to provide a solution to the above-described problems of width misalignment between the format of the input data block and the input data width of the NSD.

DETAILED DESCRIPTION

Figure 1:
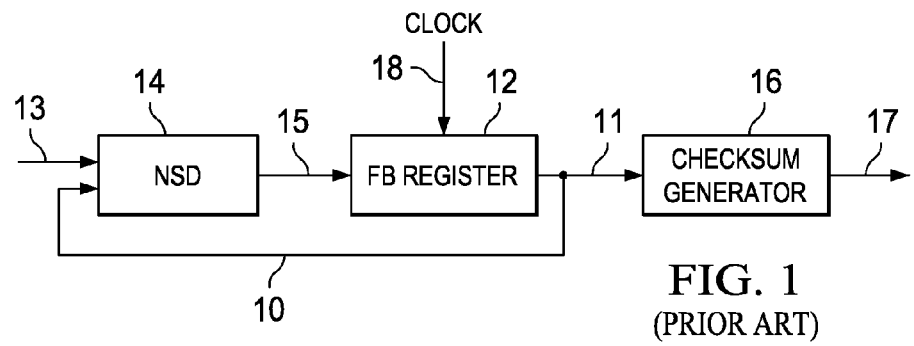
FIG. 1 diagrammatically illustrates the structure and operation of a CRC apparatus according to the prior art.
Figure 2:
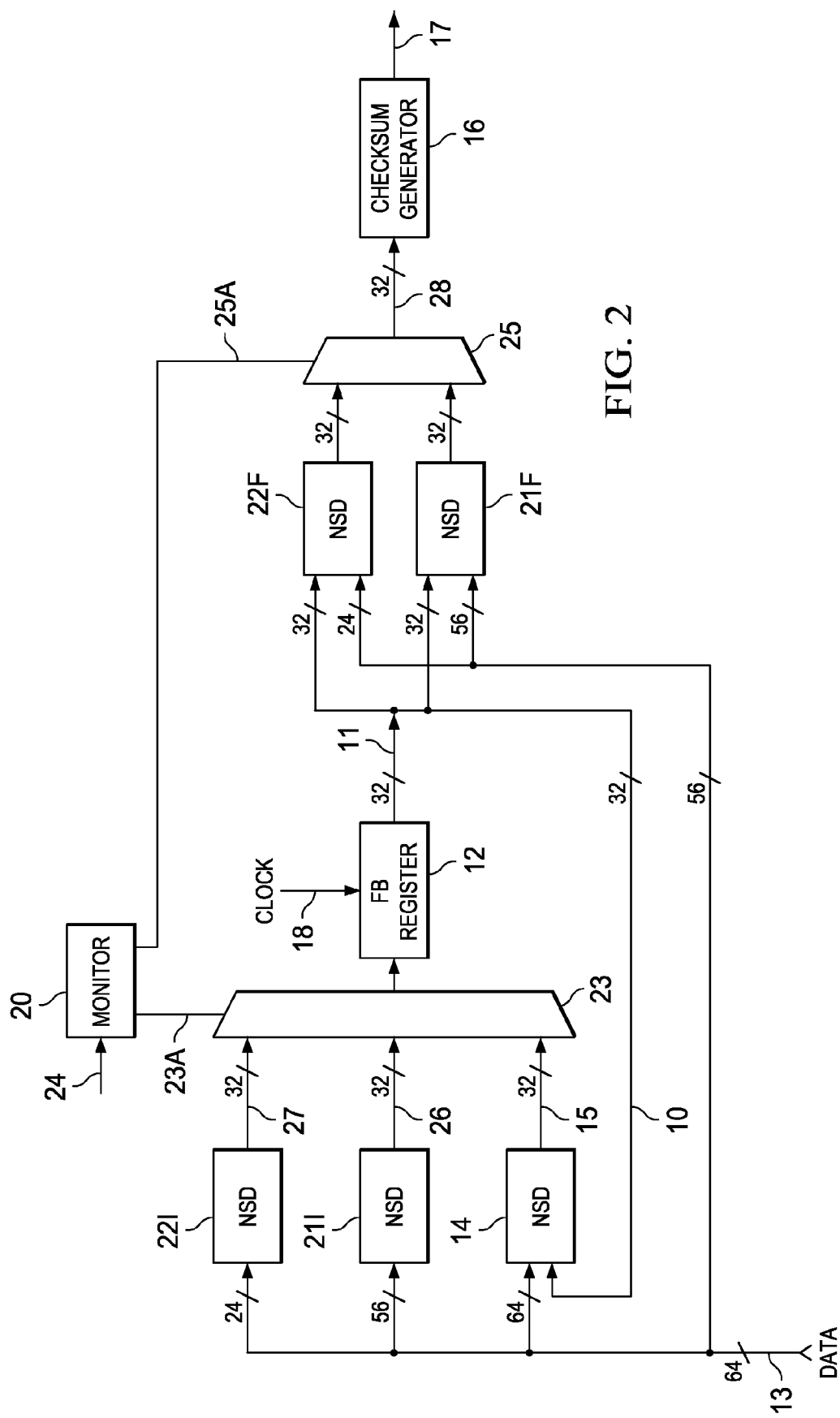
FIG. 2 diagrammatically illustrates the structure and operation of a CRC apparatus according to exemplary embodiments of the invention.

In some situations according to exemplary embodiments of the invention, the there is one byte of control information (e.g., framing information) at the beginning of the incoming data block (e.g., a data packet) that is to be ignored in the CRC processing. As an illustrative example, assume that the input data width at 13 in FIG. 1 is 64 bits, and the data in the incoming data block is naturally aligned on 32-bit boundaries. The incoming data block can be either aligned with the 64-bit input data width at 13, or misaligned to the lower (i.e., least significant) 32-bits of the 64-bit input data width. Accordingly, after the byte of control information (the first byte of the data block) is discarded from data input 13, either the least significant 56-bits or the least significant 24-bits of data remain as the first set of parallel data presented for CRC processing. FIG. 2 diagrammatically illustrates a CRC apparatus that can accommodate either of the aforementioned alignment situations according to exemplary embodiments of the invention.

The CRC apparatus of FIG. 2 includes an NSD portion having two initializing NSDs 21I and 22I coupled to the data input 13. The NSD 21I receives the lower 56 bits of the data input 13, and is configured to produce a syndrome that corresponds to those bits. Similarly, the NSD 22I receives the lower 24 bits of the data input 13, and is configured to produce a syndrome that corresponds to those bits. The initializing NSDs 21I and 22I are also referred to herein as partial width NSDs because their respective data input widths correspond to respective parts of the full 64-bit data input width supported by the data input 13. In some embodiments, the initializing syndrome selected for the CRC processing is implemented within (encoded into) the logic of each of the initializing NSDs 21I and 22I. In some embodiments (not explicitly shown), each of the initializing NSDs 21I and 22I has a syndrome input to which the selected initializing syndrome is directly applied.

A 64-bit wide NSD 14, also referred to herein as a full width NSD, is coupled to the data input 13 and configured to produce syndromes that respectively correspond to the 64-bit wide sets of parallel data that arrive within the data block after the initial 24-bit or 56-bit set of data. The NSD portion of FIG. 2 further includes a selector 23 having data inputs respectively coupled to 32-bit syndrome outputs 15, 26 and 27 of the respective NSDs 14, 21I and 22I. The selector 23 also has a 32-bit data output coupled to the input of feedback register 12. The 32-bit output 11 of feedback register 12 is coupled to the syndrome input 10 of NSD 14. The selector 23 selects the appropriate one of the NSDs 21I and 22I to produce the initial syndrome that corresponds to the initial (56-bit or 24-bit) set of data, and thereafter selects the full width NSD 14 to produce syndromes that respectively correspond to the following set(s) of 64-bit wide data within the input data block.

Continuing with the illustrative example of a 64-bit input data width and the incoming data block naturally aligned on 32-bit boundaries, the end of a given data block can be aligned to the full 64-bit width of the data input 13, or misaligned to the upper 32-bits of the data input 13. Also in accordance with the exemplary embodiments of FIG. 2, the last byte of each data block contains control information (e.g., framing information) that is to be ignored in the CRC processing. Thus, after discarding the control byte, the last set of parallel data in a block occupies either the most significant (upper) 56 bits of the input data width, or the most significant 24 bits of the input data width. The NSD portion of FIG. 2 includes finalizing NSDs 21F and 22F coupled to the data input 13. Each of these finalizing NSDs is configured to produce a syndrome that corresponds to the last set of parallel data in the data block, that is, either the last 56 bits of the block (which occupy the upper 56 bits of the data input 13), or the last 24 bits of the block (which, occupy the upper 24 bits of the data input 13). The NSD 21F receives the upper 56 bits of the data input 13, and is configured to produce a syndrome that corresponds to those bits. Similarly, the NSD 22F receives the lower 24 bits of the data input 13, and is configured to produce a syndrome that corresponds to those bits. The NSDs 21F and 22F have respective 32-bit syndrome inputs that are coupled to the output 11 of the feedback register 12. Note that, for each of the finalizing NSDs 21F and 22F, the syndrome produced by that NSD is the final syndrome that covers all of the bits of the associated data block. A selector 25 has data inputs respectively coupled to 32-bit syndrome outputs of the respective finalizing NSDs 21F and 22F. The selector 25 also has a 32-bit output 28 that provides the final syndrome to the checksum generator 16. The selector 25 thus selects which of the finalizing NSDs 21F and 22F provides the final syndrome value to be used by the checksum generator 16.

Because the final syndromes produced by the finalizing NSDs 21F and 22F are not used in any subsequent calculations, the CRC apparatus of FIG. 2 is capable of concurrently producing syndromes that are respectively associated with different data blocks. In the example of FIG. 2, when any given data block (also referred to herein as a "first data block" to facilitate exposition) in the input sequence of data blocks ends with valid data at the upper 24 bits of the data input 13, then the first 24 bits of a second data block (that immediately follows the first data block) can occupy the lower 24 bits of the data input 13 at the same time (e.g., during the same clock cycle). Also at this time, the final control byte of the first data block and the initial control byte of the second data block occupy the middle 16 bits of the data input 13. Such data blocks that occupy the data input 13 at the same time are also referred to herein as overlapped data blocks, because they present temporally overlapped sets of parallel data. The syndrome that corresponds to the last 24 bits of the first data block (the upper 24 bits of the data input 13) is produced by the finalizing NSD 22F. Concurrently with this operation of the finalizing NSD 22F (e.g., during the same clock cycle), the initializing NSD 22I (with the selected initializing syndrome either already encoded therein or applied directly thereto) produces a syndrome that corresponds to the first 24 bits of the second data block (the lower 24 bits of the data input 13). Accordingly, under the circumstances of the example described above, the CRC processing of the sequence of incoming data blocks can proceed continuously from the first data block to the second data block without the delay that would otherwise be associated with re-loading the selected initializing syndrome into a syndrome feedback register.

The CRC apparatus of FIG. 2 includes a monitor 20 that monitors conventionally available control information, designated generally at 24. For each received data block, the control information 24 indicates when the first and last sets of parallel data for that data block are present at 13. For each set of parallel data within the sequence of sets of parallel data that define a given data block, the control information 24 indicates which bits of the 64-bit wide data input 13 are valid data bits to be included in the CRC processing. Based on the control information 24, the monitor 20 (implemented as a state machine in some embodiments) produces selector control signaling as shown at 23A and 25A. The selector control signaling at 23A can control the selector 23 to select the appropriate one of the NSDs 14, 21I and 22I to produce the current syndrome. The selector control signaling at 25A can control the selector 25 to select the appropriate one of the finalizing NSDs 21F and 22F to produce the final syndrome that corresponds to the entire data block.

Various embodiments have various input data widths at 13, various natural alignment boundaries for the data, and various bit widths occupied by the control information in the data blocks. In each of the various situations, a respectively associated initializing NSD is provided for each possible data width (less than the full input data width at 13) that can be occupied by the initial set of parallel data within a data block. Furthermore, in each of the various situations, a respectively associated finalizing NSD is provided for each possible data width (less than the full input data width at 13) that can be occupied by the final set of parallel data received within a data block. The initializing NSDs and the finalizing NSDs are coupled to receive their respective data inputs from the proper bit positions within the data input 13. Again, as described with respect to FIG. 2 above, a single full-width NSD produces syndromes that respectively correspond to the sets of parallel data within the data block that have the same width as the data input, i.e., all of the sets of parallel data between the initial set and the final set.

Figure 3:
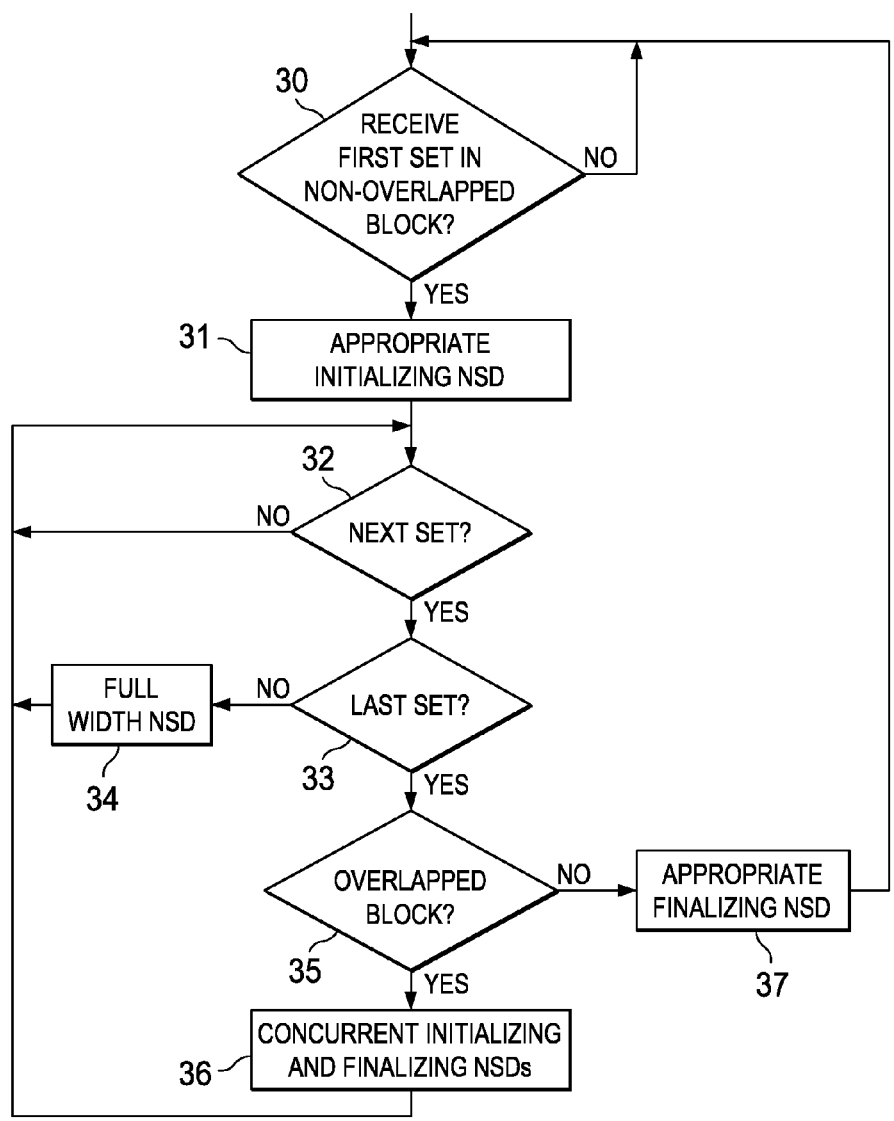
FIG. 3 illustrates operations that can be performed according to exemplary embodiments of the invention.

FIG. 3 illustrates operations that can be performed according to exemplary embodiments of the invention. In some embodiments, the apparatus of FIG. 2 is capable of performing operations illustrated by FIG. 3. As shown in FIG. 3, when the first set of parallel data in a non-overlapped data block (i.e., a data block whose first set does not temporally overlap with a previous data block) is received at 30 in FIG. 3, the appropriate initializing NSD operation is performed on that set at 31. After the next set of parallel data in the data block is received at 32, it is determined at 33 whether that set is the last set of the data block. If not, then a full width NSD operation is performed on that set at 34, after which the next set of parallel data is awaited at 32. On the other hand, when it is determined at 33 that the set received at 32 is the last set of the data block, it is then determined at 35 whether an overlapped data block condition exists. If so, the appropriate initializing and finalizing NSD operations are concurrently performed on the temporally overlapped sets of parallel data as shown at 36, after which the next set of parallel data is awaited at 32. If no overlapped data block condition is detected at 35, then the appropriate finalizing NSD operation is performed on the last set of parallel data at 37, after which the next (non-overlapped) data block is awaited at 30.

Although exemplary embodiments of the invention have been described above in detail, this does not limit the scope of the invention, which can be practiced in a variety of embodiments.

What is claimed is:

1. A cyclic redundancy check method, comprising:
   receiving a sequence of data blocks that are defined by respective sequences of sets of parallel data; and
   producing for each of said data blocks a sequence of syndromes that respectively correspond to the associated sets, wherein a final syndrome of each said sequence of syndromes corresponds to all of the data in the associated data block, said producing including concurrently producing first and second ones of said syndromes that respectively correspond to first and second ones of said sets respectively contained in first and second ones of said data blocks.

2. The method of claim 1, wherein said first and second data blocks are consecutively adjacent one another in said sequence of data blocks.

3. The method of claim 2, wherein said first and second data blocks temporally overlap one another in said sequence of data blocks, and wherein said receiving includes receiving said first and second sets concurrently.

4. The method of claim 3, wherein said receiving includes discarding control information that is associated with said first and second data blocks and is received concurrently with said first and second sets.

5. The method of claim 1, wherein said first and second sets have a same parallel data width.

6. A cyclic redundancy check apparatus, comprising:
   an input for receiving a sequence of data blocks that are defined by respective sequences of sets of parallel data; and
   a next state decoding portion coupled to said input and configured to produce for each of said data blocks a sequence of syndromes that respectively correspond to the associated sets, wherein each said sequence of syndromes contains a final syndrome that corresponds to all of the data in the associated data block, said next state decoding portion configured for concurrently producing first and second ones of said syndromes that respectively correspond to first and second ones of said sets respectively contained in first and second ones of said data blocks.

7. The apparatus of claim 6, wherein said first and second data blocks are consecutively adjacent one another in said sequence of data blocks.

8. The apparatus of claim 7, wherein said first and second data blocks temporally overlap one another in said sequence of data blocks, and wherein said input receives said first and second sets concurrently.

9. The apparatus of claim 8, wherein said input receives, concurrently with said first and second sets, control information associated with said first and second data blocks, and wherein said next state decoding portion discards said control information.

10. The apparatus of claim 6, wherein said first and second sets have a same parallel data width.

11. A cyclic redundancy check apparatus, comprising:
    a data input for receiving a sequence of sets of parallel data;
    a next state decoding portion coupled to said data input and configured to produce a sequence of syndromes based on said sequence of sets, said sequence of syndromes including a final syndrome that corresponds to all of the data in said sequence of sets, said next state decoding portion including first and second next state decoders coupled to said data input, each of said first and second next state decoders having a syndrome input and a syndrome output;
    said next state decoding portion including a register having an input and an output, said register input coupled to said syndrome output of said first next state decoder, and said register output coupled said syndrome inputs of said first and second next state decoders; and
    a final syndrome output at which said final syndrome is provided;
    wherein said syndrome output of said second next state decoder is coupled to said final syndrome output independently of said register.

12. The apparatus of claim 11, wherein said first next state decoder is configured to produce syndromes that correspond to respective ones of said sets that have a first parallel data width, and said second next state decoder is configured to produce syndromes that correspond to respective ones of said sets that have a second parallel data width that differs from said first parallel data width.

13. The apparatus of claim 12, wherein said next state decoding portion includes a third next state decoder coupled to said data input, said third next state decoder having a syndrome output coupled to said register input, said third next state decoder configured to produce syndromes that correspond to respective ones of said sets that have a third parallel data width that differs from said first parallel data width.

14. The apparatus of claim 13, wherein said next state decoding portion includes a fourth next state decoder coupled to said data input, said fourth next state decoder having a syndrome input coupled to said register output, and having a syndrome output coupled to said final syndrome output independently of said register.

15. The apparatus of claim 14, wherein said next state decoding portion includes a selector for coupling said final syndrome output to a selected one of said syndrome outputs of said second and fourth next state decoders.

16. The apparatus of claim 15, wherein said next state decoding portion includes a further selector for coupling said register input to a selected one of said syndrome outputs of said first and third next state decoders.

17. The apparatus of claim 11, wherein said next state decoding portion includes a third next state decoder coupled to said data input and having a syndrome output coupled to said register input.

18. The apparatus of claim 17, wherein said first next state decoder is configured to produce syndromes that correspond to respective ones of said sets that have a first parallel data width, and said third next state decoder is configured to produce syndromes that correspond to respective ones of said sets that have a second parallel data width that differs from said first parallel data width.

19. The apparatus of claim 17, wherein said next state decoding portion includes a selector for coupling said register input to a selected one of said syndrome outputs of said first and third next state decoders.

20. The apparatus of claim 17, wherein, said third next state decoder is configured to produce an initial syndrome of said sequence of syndromes, and includes logic that implements a predetermined initializing syndrome upon which said initial syndrome is based.

* * * * *